(12) United States Patent
Liu et al.

(10) Patent No.: US 6,277,745 B1
(45) Date of Patent: Aug. 21, 2001

(54) PASSIVATION METHOD OF POST COPPER DRY ETCHING

(75) Inventors: Chung-Shi Liu; Shau-Lin Shue; Syun-Ming Jang; Chen-Hua Yu, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/221,965

(22) Filed: Dec. 28, 1998

(51) Int. Cl.$^7$ .................................................... H01L 21/44
(52) U.S. Cl. ..................... 438/687; 438/624; 438/627; 438/643; 438/653
(58) Field of Search .................................. 438/687, 688, 438/706, 624, 642–643, 653, 656, 627, 685, 669

(56) References Cited

U.S. PATENT DOCUMENTS

| | | | |
|---|---|---|---|
| 4,252,862 | * | 2/1981 | Nishida .................. 428/457 |
| 5,277,985 | | 1/1994 | Li et al. ................. 428/432 |
| 5,539,256 | * | 7/1996 | Mikagi ................... 257/763 |
| 5,595,937 | | 1/1997 | Mikagi ................... 437/192 |
| 5,705,857 | | 1/1998 | Farooq et al. ............ 257/762 |
| 5,719,447 | * | 2/1998 | Gardner .................. 257/762 |
| 5,744,394 | | 4/1998 | Iguchi et al. ............ 438/276 |
| 5,903,053 | * | 5/1999 | Iijima et al. ............ 257/751 |
| 5,909,635 | * | 6/1999 | Marieb et al. ........... 438/625 |
| 5,976,986 | * | 11/1999 | Naeem et al. ........... 438/714 |
| 6,010,966 | * | 1/2000 | Ionov .................... 438/706 |
| 6,033,986 | * | 3/2000 | Itoh ..................... 438/673 |
| 6,054,380 | * | 4/2000 | Naik ..................... 438/624 |
| 6,080,529 | * | 6/2000 | Ye et al. ................. 430/318 |

\* cited by examiner

*Primary Examiner*—Charles Bowers
*Assistant Examiner*—Thanh Nguyen
(74) *Attorney, Agent, or Firm*—George O. Saile; Stephen B. Ackerman

(57) ABSTRACT

The present invention relates to a new structure and method for the passivation of copper electrical interconnects for the semiconductor industry. More particularly, the invention details a convenient method for completing the passivation of copper lines after they have been patterned by a dry etch process. The method includes the formation of a sandwich structure consisting of a bottom barrier layer, a copper layer and a top barrier layer. After the sandwich structure is patterned with a dry etch, for example, the resultant exposed copper sidewalls are then passivated by means of a barrier metal spacer process. The fully encapsulated copper lines are highly resistant to oxidation, which is an, otherwise, inherent problem associated with the lack of self passivation/exhibited by bare copper films.

14 Claims, 2 Drawing Sheets

PASSIVATION METHOD OF POST COPPER DRY ETCHING

FIELD OF THE INVENTION

The invention relates to the fabrication of integrated circuit devices, and more particularly, to a method for passivating copper layers after they have been patterned by dry etching.

BACKGROUND OF THE INVENTION AND PRIOR ART

For the fabrication of integrated circuits the technological challenges of patterned metallization have continually increased as device dimensions have progressed into the sub micron regime. For integrated circuit needs, in general, metallization requirements have continued to be that of low bulk resistivity, high resistance to electromigration and high resistance to corrosion and oxidation, to name a few. Aluminum and its alloys have long been the materials of choice for meeting such requirements. However, as device dimensions have further progressed down into the deep sub micron regime, aluminum has started to become a serious limitation for circuit speed and copper, Cu, has emerged as its likely successor. This is due to the undesirable trend of metallization interconnects becoming a very significant contributor to signal delays on a chip, in comparison to inherent device delays. These interconnect related signal delays are associated with the line resistance, R, of the interconnect, along with the distributed capacitance, C, between the interconnect lines and signal ground. Relatively high values of R tend to limit the rate of electrical charging of C, in order for signals to rapidly propagate from one device to another. Hence, such undesirable delays increase with an increasing RC product. Unfortunately, as device dimensions have continued to shrink, efforts to maintain a sufficiently minimized RC product have encountered serious materials limitations. Consequently, new materials, such as copper interconnects and low dielectric constant (k) inter level insulators are being developed for near term and future products. If one could simply change from aluminum (bulk resistivity=2.65 uohm-cm) to copper (bulk resistivity=1.67 uohm-cm), the value of R would be reduced by about 37%. Similarly, for inter level insulators, changing from a common present day material, TEOS (k=4.2), to a recent experimental material, such as xerogel (k=1.3–3.0), substantial reductions in the value of C would also be expected.

The search for a generally acceptable inter level insulator material, with a sufficiently low value of k, is still open to investigation. In contrast, the search for an inter level metal material, with a sufficiently low value of bulk resistivity, has already narrowed down to copper, mainly. Copper is also superior to aluminum, in terms of higher resistance to electromigration. However, copper has its own particular problems. In contrast to aluminum, some of the problems with copper are: (1) The ability to rapidly diffuse into silicon device regions and behave as a highly detrimental generation-recombination center, (2) poor adhesion to insulator surfaces, and (3) the inability to produce a self passivating oxide film that will minimize corrosion and further oxidation. Considerable development efforts in the semiconductor industry have already taken place for minimizing such problems. The general approach has been to encapsulate the copper lines with one or more of a group of materials that tend to self passivate while also acting as a diffusion barrier to copper. Such self passivating barrier materials, frequently mentioned in outside publications, are: Titanium Nitride, TIN, and other refractory metals such as Tantalum, Ta, Molybdenum, Mo, Niobium, Nb and Chromium, Cr.

U.S. Pat. No. 5,277,985, to Li, et. al., teaches a method for encapsulating copper interconnect lines with a TiN film. The method exploits the alloying of copper with titanium as a means of eventually forming a Titanium rich film on the surface of a patterned copper interconnect, after a rapid thermal heat treatment. Following a lift off process to pattern the copper interconnect layer, the titanium surface film is subsequently converted to TiN by a relatively low temperature heat treatment in an ammonia atmosphere. Although, perhaps, lending itself to the passivation of copper lines after a dry etch, once an alloy is formed between Cu and Ti, the resultant consumption of Cu will result in higher undesirable contact resistance.

U.S. Pat. No. 5,705,857, to Farooq et. al., teaches a method for encapsulating copper interconnect lines using protective barrier layers, such as Ti, Cobalt, Co, and Cr. The copper is first selectively plated through a patterned photoresist layer and onto a combined seed layer (such as a thin film of copper) and barrier layer (such as titanium). A subsequent heat treatment causes the photoresist to pull back and expose the side walls of the resultant patterned copper layer, whose top surface and side walls are then capped off by a final barrier material such as Nickel, Ni. This method has been developed for a plating based process and the associated thermal pull back of the photoresist layer seems difficult to control, during manufacturing, for addressing side wall passivation after a dry etch process.

U.S. Pat. No. 5,744,394, to Iguchi, et. al., teaches a series of damascene process steps for forming patterned copper interconnects with barrier layers composed of Ti, or Ta or Tungsten, W containing compounds. U.S. Pat. No. 5,595,937, to Mikagi, also teaches a series of damascene process steps for forming patterned copper interconnects with the added feature of a seamless interface to underlying copper contact plugs. In one preferred embodiment, a thin laminate of TiN/Ti is used as the barrier material. In addition an underlying silicon nitride spacer is employed as part of the overall barrier layer for the subsequently formed copper contact plugs. The passivation methods employed in these damascene based methods are dependent on the presence of a barrier material on buried copper sidewalls prior to copper patterning (with Chemical Mechanical Polishing, CMP) and are, therefore, only suitable for a damascene process.

SUMMARY OF THE INVENTION

A principle object of the present invention is to provide an effective and very manufacturable method of passivating copper lines over a semiconductor substrate.

Another object of the present invention is to provide a method of first forming a copper layer, whose bottom and top surfaces are protected by barrier layers, and then passivating the resultant side walls of said copper layer after it has been patterned.

A further object of the invention is provide a method of passivating the side walls copper lines after they have been formed by some means that has resulted in exposed, unprotected side walls.

A still further object of the invention is to provide a method for passivating copper lines, comprising the steps of:

(a) Depositing a first barrier layer over a semiconductor substrate;

(b) depositing a layer of copper over said first barrier layer;

(c) depositing a second barrier layer over said copper layer;

(d) patterning the resultant barrier-copper-barrier sandwich to form conductive lines;

(e) depositing a passivation layer over said conductive lines; and (f) etching back, anisotropically, to form protective spacers on the side walls of said conductive lines.

The invention provides a method to solve the problem of how to passivate copper lines that have been formed by means of dry etching, as opposed to a Damascene process. Copper lines are formed over the semiconductor substrate. The copper lines have top and bottom barrier layers and their side walls uncovered. A passivation layer is deposited over said copper lines. The passivation layer is anisotropically etched back to form protective spacers on the side walls of said copper lines.

BRIEF DESCRIPTION OF THE DRAWINGS

In the accompanying drawings forming a material part of this description, there is shown.

DESCRIPTION OF THE PREFERRED EMBODIMENTS

Figure 1A:
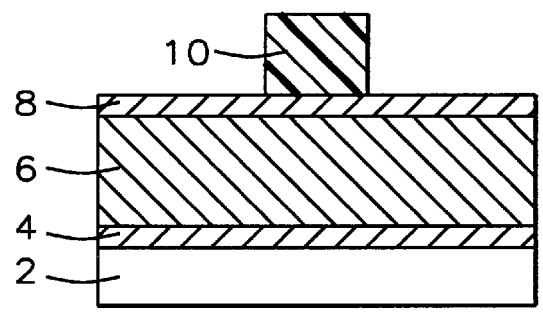
FIGS. 1A through 1D schematically illustrate in cross-sectional representation a preferred embodiment of the process of the present invention.

Referring now more particularly to FIG. 1A, there is shown a portion of a Partially completed integrated circuit. There is shown a semiconductor substrate 2 intended to represent a number of common situations such as the surface of some semiconductor, conductor or insulator. A bottom barrier layer 4, intended to passivate the underside of an overlying copper layer 6, is shown on the surface of the semiconductor substrate 2. A top barrier layer 8 is used to passivate the top side of the copper layer 6. The aforementioned bottom and top barrier layers 4 and 8 may comprise materials such as TaN, TiN, Ta, or various single or stacked combinations, thereof. TaN is most preferred as the bottom passivation material with TiN being relatively less preferred due to the possibility of adhesion problems with Cu. For the top barrier layer, both TaN and Ta are preferred with TiN, again, being relatively less preferred due to adhesion concerns with Cu. Regarding stacked passivation materials, Ta/TaN (with Ta on the bottom and the TaN on the top) are usually a more preferred embodiment.

In addition to Ta, layers 4 and 8 may comprise other refractory metals such as Mo, Nb, or Cr. The deposition methods for the aforementioned layers 4,6 and 8 may be by means of Physical Vapor Depostion, PVD, or Chemical Vapor Deposition, CVD, for example. The typical thickness range for the bottom barrier layer 4 is between about 100 angstroms to 500 angstroms.

The typical thickness range for the top barrier layer 8 is also between about 100 to 500 angstroms. The passivating thickness of these top and bottom barrier layers will depend on which material (TaN, etc.) is being used. Usually, the lower barrier layer will be thinner, depending upon design rules and other considerations, such as whether the bottom barrier will be used as a via barrier and the aspect ratio of the via. Barriers formed by CVD will tend to have better step coverage and can, therefore, be relatively thinner. The thickness choice for top barrier layers must, for example, be sufficient to endure etch back steps that could, otherwise, cause underlying Cu surfaces to be damaged. Usually, a thickness greater than 50 angstroms will be enough to act as a copper barrier layer.

The typical thickness range for the aforementioned copper layer 6 is between about 3000 to 12000 angstroms.

Figure 1B:
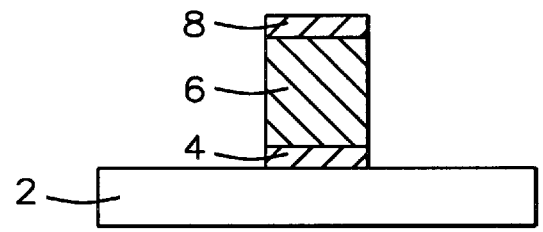

A conventional masking operation is then used to form photoresist islands 10 that will be used to define the patterning of the aforementioned top barrier layer 8, underlying copper layer 6 and further underlying bottom barrier layer 4 into conductive lines. A conventional dry etch process is now used to form the patterned conductive lines. FIG. 1B shows the resultant patterned lines after the completion of the aforementioned dry etch process as well as the subsequent removal of the aforementioned photoresist islands 10. The dry etch process could, for example, be performed using: a $Cl_2/N_2$ etching ambient, a chamber pressure of about 5 mTorr, an RF power level of about 300 W and a temperature of about 200–300° C. For such conditions, an etch rate of about 3000 A/min. can be obtained.

Figure 1C:
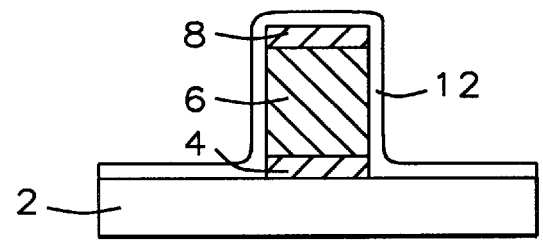
Figure 1D:
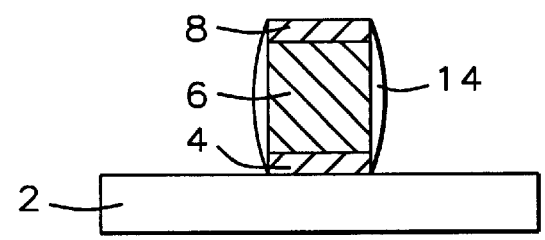

An additional passivating layer 12 is deposited over said structure in FIG. 1B, as shown in FIG. 1C. A blanket anisotropic dry etch process is then used to etch back said passivating layer 12, in order to form protective spacers 14, as shown in FIG. 1D. Said additional passivating layer 12 may also comprise materials selected from the group consisting of Ta, TaN, TiN or combinations thereof. In addition to Ta, said additional passivating layer 12 may also comprise other refractory metals such as Mo, Nb or Cr. Said additional passivating layer 12 may also be deposited by means of PVD or CVD. A typical thickness range for said layer 12 is between about 100 angstroms and 500 angstroms. The choice of thickness will depend on whether said passivating layer 12 has been formed by PVD or CVD and the aspect ratio between Cu lines, with CVD barrier layers able to be thinner due higher step coverage. A relatively larger thickness value could result in potential line to line leakage.

For the purpose of sidewall passivation (spacers), a barrier thickness of about 50 angstroms is usually preferred.

Figure 2A:
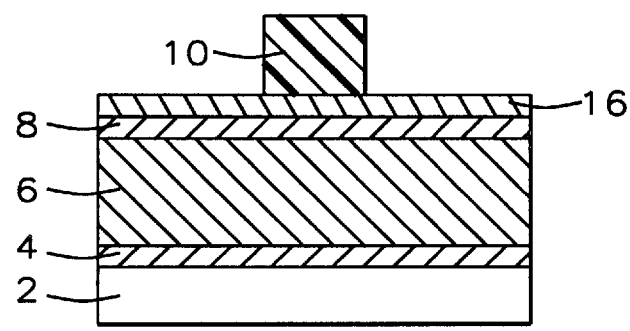
FIGS. 2A through 2D schematically illustrate in cross-sectional representation an alternative preferred embodiment of the process of this invention.

The objects of the invention have now been accomplished. Patterned copper lines have now been formed which are fully passivated with protective barrier layers on all sides. More particularly, the exposed side walls of patterned copper lines, following a dry etch process, have now been passivated, by means of barrier spacer process An alternative preferred embodiment will now be introduced, which circumvents a difficulty that can arise in the first preferred embodiment that was just described. The first preferred embodiment, shown in FIGS. 1A–1D, used a conventional photoresist masking layer 10 as a dry etch mask for patterning copper lines. However, there are situations where the dry etching of copper is not feasible unless rather high substrate temperatures (on the order to 250 C) are used. Such high processing temperatures then pose a survival difficulty for the photoresist masking layer 10, in FIG. 1A Consequently, the dry etching of copper may alternatively be done in the presence of a so-called "hard mask" that is able to withstand higher temperatures. Accordingly, the alternative preferred embodiment, as shown in FIG. 2A, is essentially the same as the first preferred embodiment, shown in FIG. 1A, except for an additional layer 16 that will eventually be used as a hard mask for the dry etching of the copper. The hard mask must be able meet Anti-Reflection Coating (ARC) requirements, for high resolution photolithography, while also sustaining minimal loss during spacer etch and line etch without incurring metal stack damage.

Figure 2B:
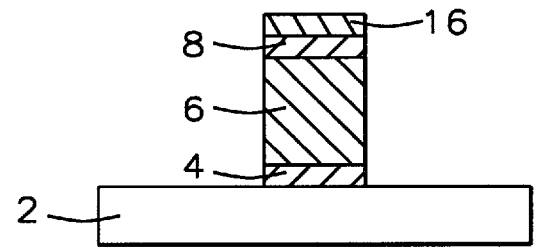
Figure 2C:
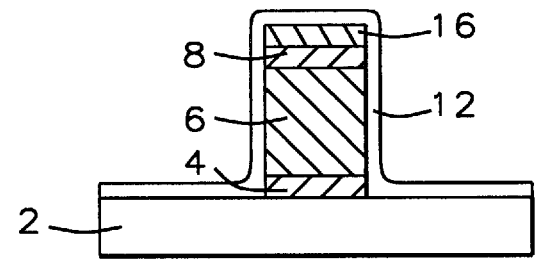
Figure 2D:
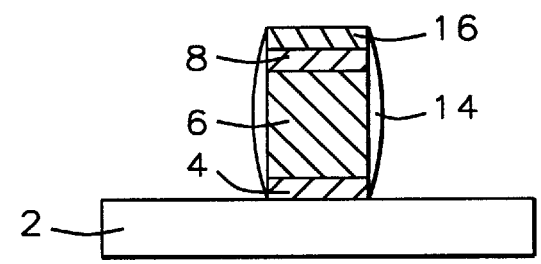

Said layer 16 in FIG. 2A represents a number of possible material choices, such as polyimide, CVD SiO2 or CVD Si3N4, that would first be patterned by a conventional photoresist mask and etch process. For the present invention, $Si_3N_4$ or $S_iON$ are more preferred. After said layer 16 is patterned, photoresist masking layer 10 would be removed, in preparation for the dry etching of the copper layer 6 and associated top and bottom barrier layers 8 and 4. FIG. 2B shows the end result of the dry etch step where the only difference with respect to FIG. 1B, in the previously described first preferred embodiment, is the remaining patterned hard mask layer 18. The processing shown in FIGS. 2C and 2D then continues in the same manner that has already been described for the first preferred embodiment. For the purpose of clarity, the preferred alternate embodiment may be considered as a hard mask version of the first preferred embodiment.

The object of this invention has now also been accomplished by the preferred alternate embodiment, shown is FIGS. 2A–2D, which used a hard mask for the dry etching of copper. Copper lines have now been formed which are fully passivated with protective barrier layers on all sides. More particularly, the exposed side walls of patterned copper lines, following a dry etch process, have now been passivated by means of a barrier spacer process. It is noted that the example of a hard mask process that was presented in said alternate preferred embodiment is not intended to limit this invention from the possibility of other hard mask processes, such as those based on selective silyation (silicon enrichment) of photoresist, for example.

While the invention has been particularly shown and described with reference to the preferred embodiments thereof, it will be understood by those skilled in the art that various changes in form and details may be made without departing from the spirit and scope of the invention.

What is claimed is:

1. A method of passivating copper lines, comprising the steps of:
   a) forming said copper lines over a semiconductor substrate, said copper lines having top and bottom barrier layers passivated by 100–500 Angstroms of TaN and their side walls uncovered;
   b) depositing a 100–500 Angstrom TaN passivation layer over said copper lines; and
   c) anisotropically etching back said passivation layer to form protective spacers on the side wall of said copper lines.

2. The method of claim 1, wherein said barrier and passivation layers also include stacked materials.

3. The method of claim 2, wherein said stacked materials are Ta/TaN.

4. A method of passivating a copper line, comprising the steps of a) forming a patterned Ta/Cu/TaN sandwich structure over a semiconductor substrate, wherein bottom said TaN is a barrier layer 100–500 Angstroms thick said copper is the conductor and top said TaN is a barrier layer 100 Angstroms thick; forming a passivation layer over said patterned TaN/Cu/TaN sandwich structure; and
   b) etching back said passivation layer to form a protective barrier spacer on the sidewalls of said patterned TaN/Cu/TaN sandwich structure, thereby completing the passivation of said copper line.

5. A method of passivating the side walls of a patterned TaN/Cu/TaN layer, comprising the steps of:
   a) forming a continuous first TaN layer over said patterned TaN/Cu/TaN layer having exposed Cu side walls; and
   b) etching back said continuous first TaN layer to form a passivating 100–500 Angstrom TaN barrier metal spacer on the side walls of said patterned TaN/Cu/TaN sandwich structure.

6. The method of claim 5, wherein said passivating spacer may consist of Ta or TiN.

7. The method of claim 5, wherein said passivating spacer may consist of stacked materials.

8. The method of claim 5, wherein said passivating spacer may consist of stacked materials such as Ta/TaN.

9. A method of passivating copper lines, comprising the steps of:
   a) depositing a first 100–500 Angstrom Ta or TaN barrier layer over a semiconductor substrate;
   b) depositing a layer of copper over said first barrier layer,
   b) depositing a second 100–500 Angstrom Ta or TaN barrier layer over said copper;
   d) patterning said second barrier layer, said copper and said first barrier layer to form conductive lines;
   e) depositing a 100–500 Angstrom Ta or TaN passivation layer over said conductive lines; and
   f) etching back, anisotropically, to form protective spacers on the sidewalls of said conductive lines, particularly said copper portion.

10. The method of claim 9, wherein said first barrier layer comprises Ta or TaN deposited by PVD or CVD.

11. The method of claim 9, wherein said copper layer is deposited by PVD or CVD to a thickness of between about 3000 and 12000 angstroms.

12. The method of claim 9, wherein said second barrier comprises Ta or TaN deposited by PVD or CVD.

13. The method of claim 9, wherein said passivation layer is deposited by PVD or CVD.

14. The method of claim 9, wherein said etchback is performed by means of a Cl or F based etcher.

* * * * *